United States Patent
Bilbao De Mendizabal et al.

(10) Patent No.: US 10,712,143 B2
(45) Date of Patent: Jul. 14, 2020

(54) SENSOR WITH MULTIPLE SENSING ELEMENTS

(71) Applicant: Melexis Technologies SA, Bevaix (CH)

(72) Inventors: Javier Bilbao De Mendizabal, Zurich (CH); Lucian Barbut, Renens (CH)

(73) Assignee: Melexis Technologies SA, Bevaix (CH)

( * ) Notice: Subject to any disclaimer, the term of this patent is extended or adjusted under 35 U.S.C. 154(b) by 257 days.

(21) Appl. No.: 15/866,892

(22) Filed: Jan. 10, 2018

(65) Prior Publication Data

US 2018/0195852 A1 Jul. 12, 2018

(30) Foreign Application Priority Data

Jan. 10, 2017 (EP) .................................... 17150856

(51) Int. Cl.
| | | |
|---|---|---|
| *G01K 7/00* | (2006.01) | |
| *G01K 3/00* | (2006.01) | |
| *G01B 9/02* | (2006.01) | |
| *G01D 21/02* | (2006.01) | |
| *H01L 25/065* | (2006.01) | |
| *G01D 3/036* | (2006.01) | |
| *G01R 33/00* | (2006.01) | |
| *G05B 19/042* | (2006.01) | |
| *G05D 23/19* | (2006.01) | |
| *H01L 27/08* | (2006.01) | |

(52) U.S. Cl.
CPC ....... *G01B 9/02007* (2013.01); *G01D 3/0365* (2013.01); *G01D 21/02* (2013.01); *G01R 33/0052* (2013.01); *G05B 19/042* (2013.01); *G05D 23/1917* (2013.01); *H01L 25/0657* (2013.01); *H01L 27/0802* (2013.01)

(58) Field of Classification Search
None
See application file for complete search history.

(56) References Cited

U.S. PATENT DOCUMENTS

| | | | |
|---|---|---|---|
| 7,116,101 | B1 | 10/2006 | Bear et al. |
| 7,622,367 | B1 | 11/2009 | Nuzzo et al. |
| 8,506,867 | B2 | 8/2013 | Menard |
| 8,722,458 | B2 | 5/2014 | Rogers et al. |

(Continued)

FOREIGN PATENT DOCUMENTS

| | | |
|---|---|---|
| DE | 19626083 A1 | 1/1998 |
| DE | 102013213053 A1 | 1/2015 |

(Continued)

OTHER PUBLICATIONS

European Search Report from EP Application No. 17150856.7, dated Jun. 27, 2017.

(Continued)

*Primary Examiner* — Mirellys Jagan
(74) *Attorney, Agent, or Firm* — Workman Nydegger

(57) ABSTRACT

A multi-element sensor includes a substrate having a surface. A first sensing element for sensing an environmental attribute is disposed on or over the substrate surface. A second sensing element is disposed over the same substrate surface as the first sensing element, above the first sensing element in a direction orthogonal to the substrate surface. The second sensing element is arranged for sensing the same environmental attribute. In one configuration, the first and second sensing elements sense the same environmental attribute at a location between the first and second sensing elements.

20 Claims, 7 Drawing Sheets

(56) References Cited

U.S. PATENT DOCUMENTS

| | | |
|---|---|---|
| 9,520,537 B2 | 12/2016 | Bower et al. |
| 2015/0227254 A1 | 8/2015 | Kim et al. |
| 2016/0093600 A1 | 3/2016 | Bower et al. |
| 2016/0299200 A1 | 10/2016 | Taylor et al. |

FOREIGN PATENT DOCUMENTS

| | | |
|---|---|---|
| EP | 0523716 A1 | 1/1993 |
| EP | 2664897 A1 | 11/2013 |
| WO | 2012053296 A1 | 4/2012 |
| WO | 2016021480 A1 | 2/2016 |

OTHER PUBLICATIONS

Cok et al., "AMOLED Displays with Transfer-Printed Integrated Circuits," Journal of the Society for Information Display, 2011, pp. 335-337.

European Office Action from Application No. EP17150856.7, dated Nov. 13, 2019.

SENSOR WITH MULTIPLE SENSING ELEMENTS

FIELD OF THE INVENTION

The present invention relates to sensors incorporating multiple sensing elements.

BACKGROUND OF THE INVENTION

Sensors are widely used in electronic devices to measure attributes of the environment and report a measured signal value. For example, U.S. Patent Publication No 20160299200 describes a Hall effect sensor for measuring magnetic fields. However, sensors are typically limited in range and sensitivity over the range, have a limited signal-to-noise level, or can be faulty. For example, current sensors are often optimized either for large-current sensing over a relatively wide signal-value range or for small-current sensing with greater sensitivity over a relatively smaller signal-value range. Some sensors include an analog-to-digital converter that converts a measured, analog value to a digital value having a specific number of bits. The signal value represented by the digital value can have either a large range with smaller specificity (sensitivity) or a small range with greater specificity (sensitivity). Thus, conventional sensor design incorporates a tradeoff between range and sensitivity.

Two solutions presently exist in order to mitigate such tradeoffs. One solution includes an electronic circuit with a dynamic amplification step. Another solution uses two sensors with different sensitivities. For example, WO2012/053296 describes a current sensor with first and second current sensors having different ranges. WO2016/021480 describes a current sensor with first and second magnetic sensors whose output is selected on the basis of a sensor measurement compared to a threshold value. However, the measured value of a sensor is at least partly dependent on the sensor's location in the environment, particularly for environmental attributes such as electrical or magnetic fields, or electromagnetic radiation, leading to confusion as to which sensed value is more representative of the desired environmental attribute. Hence, the first and second magnetic sensors, in this example, might actually measure magnetic fields at different locations.

Sensors also have a signal-to-noise ratio dependent on the sensor and circuitry for processing sensed attribute signal values. It is useful to reduce the signal-to-noise ratio as far as possible.

Sensors can also be defective and provide anomalous signal values or can cease to function entirely. Furthermore, it is helpful, in some applications, to reduce the physical size of the sensor.

There is a need, therefore, for devices, systems and methods for improving sensors that can overcome such deficiencies.

SUMMARY OF THE INVENTION

It is an object of embodiments of the present invention to provide improved sense signals from a multi-element sensor.

In a first aspect, a multi-element sensor comprises a substrate having a surface and a first sensing element disposed on or over the substrate surface. The first sensing element is arranged to sense an environmental attribute. A second sensing element is disposed over the same substrate surface as the first sensing element, above the first sensing element in a direction orthogonal to the substrate surface, and is arranged to sense the same environmental attribute. The first and second sensing elements can each be a sensor.

The first sensing element can be substantially identical to the second sensing element, can be a different sensor than the second sensing element, or can be configured differently from the second sensing element. The first sensing element can have a different range or sensitivity from the second sensing element.

The first and second sensing elements can be disposed on the same or opposite sides of a sensed element and can sense the environmental attribute in a location between the first and second sensing elements. It is an advantage of embodiments of the present invention that the sensed element may provide physical, structural, or mechanical support to other elements (e.g. provide support to the first and second sensing elements).

The first sensing element can have a similar, a reversed, a rotated, or a mirrored spatial orientation from the second sensing element. It is an advantage of embodiments of the present invention that a more accurate and consistent signal response can be enabled by allowing the first and second sensing elements to more accurately measure the same environmental attribute.

The first and second sensing elements can be one or more of transducers, current sensors, magnetic field sensors, electromagnetic field sensors, electrical field sensors, temperature sensors, vibration sensors, strain sensors, and acoustic sensors.

In an embodiment, the first sensing element provides a first sense signal, the second sensing element provides a second sense signal, and the first and second sense signals together provide a combined sense signal. The combined sense signal can have at least one different attribute than either the first signal or the second signal. The combined sense signal can have a greater signal-to-noise ratio, a greater range, or a greater sensitivity than either of the first or second signals.

In an embodiment, multiple first and second elements are provided, which can provide separate signals for increased fault tolerance, redundancy or comparative measurements to enable a more fault tolerant, functionally safe, and accurate sensing capability.

In an embodiment, the first sensing element is adapted for providing a first sense signal, the second sensing element is adapted for providing a second sense signal, and a controller having a control circuit is adapted for receiving the first and/or second sense signals. The controller can provide control or operational signals to the first and second sensing elements. The controller can be disposed on the substrate or the sensed element. The controller can produce a combined sense signal from the first and second sense signals. Additionally or alternatively, the control circuit can measure the first and second sense signals and, responsive to the measurement, select the first sense signal or the second sense signal. Additionally or alternatively, the control circuit can control the first and second sensing elements and alternately operate the first and second sensing elements. Additionally or alternatively, the control circuit can control the first and second sensing elements, measure the first and second sense signals and, responsive to the measurement, operate either the first sensing sense element or the second sensing element. Additionally or alternatively, the control circuit can control the first and second sensing elements, repeatedly measure one of the first and second sense signals and, responsive to the measured signal, measure the other of the first and second sense signals. Additionally or alternatively, the control circuit can measure the first and second sense signals, compare the first and second sense signals, and, responsive to the comparison, determine a fault in either one of the sensing elements or in the readout chain. This can be done for example by comparing the readouts of both sensors in the digital part after conversion every X readouts (for instance once every 10 ns, 0.1 us, 1 us, 10 us, 100 us, 1 ms, 100 ms or 1 s).

It is an advantage of embodiments of the present invention that the combined sense signal can have a greater signal-to-noise ratio, a greater range, or a greater sensitivity than either the first or second signals.

In an embodiment, the multi-element sensor includes a number of sensing elements and the control circuit operates the same number of sensing elements.

In an embodiment, in operation either the first or second sensing element may be not functional and the controller detects the non-functional sensing element, selects signals from the functional sensing element, or operates only the functional sensing element. Thus, in various embodiments, the second sensing element is a redundant sensing element to the first sensing element, which can provide fault tolerance to the first sensing element, or functional safety by providing a backup to the first sensing element.

In an embodiment, one of the length, width, or depth of the multi-element sensor, first sensing element, or second sensing element is less than or equal to one micron, two microns, three microns, five microns, ten microns, twenty microns, fifty microns, or one hundred microns. The second sensing element can be a redundant sensing element to the first sensing element.

It is an advantage of embodiments of the present invention that small sensing elements enable small multi-element sensors that can be used in restricted volumes and at lower costs.

In an embodiment, the first sensing element or the second sensing element, or both, is a micro-transfer printed sensing element having a fractured or separated tether. In another embodiment, the multi-element sensor is a micro-transfer printed sensor with a fractured or separated tether.

In a configuration, the second sensing element overlaps the first sensing element in a direction normal to the surface of the substrate. In one arrangement, the first and second sensing elements are similar or identical and are located one directly over or under the other. It is an advantage of embodiments of the present invention that the physical size or extent of the multi-element sensor can be reduced, and/or the measurement consistency can be improved by locating the first and second sensing element closer together so that they take measurements at the same, or nearly the same, physical location.

In a second aspect, a plurality of multi-element sensors according to embodiments of the first aspect are provided.

In some embodiments, the multi-element sensors of said plurality are disposed around a central point (in the plane or in the space). For example, the multi-element sensors are equidistant from the central point, in two or three dimensions.

Embodiments of the present invention provide sensors having improved signal location specificity, reduced signal-to-noise ratios, expanded range and sensitivity, reduced size, and improved fault tolerance.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
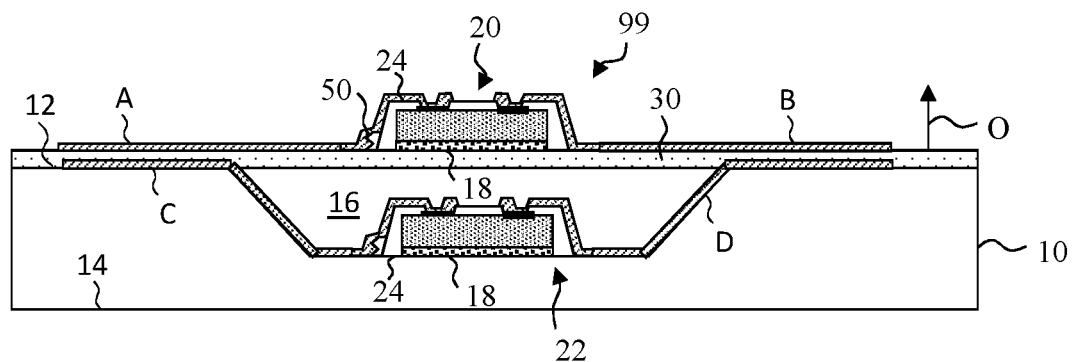
FIG. 1 is a cross section of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention provide sensors having improved location specificity, reduced signal-to-noise ratios, expanded range and sensitivity, reduced size, and improved fault tolerance by using first and second sensing elements in a multi-element sensor. Referring to FIG. 1, a multi-element sensor 99 according to an embodiment of the present invention includes a substrate 10 having a substrate surface 12, for example the surface of a first side 12 of the substrate 10. The substrate 10 can have a second side 14 opposite the first side 12. As intended herein, a side of the substrate 10 includes a surface of the substrate 10. In an embodiment, the first and second sides 12, 14 can be substantially parallel or have substantially parallel portions. By substantially parallel is meant that the first and second sides 12, 14 are parallel within the tolerances defined by the manufacturing processes used to make the substrate 10. The substrate 10 can be a glass, plastic, ceramic, metal, or other substrate material and useful substrates 10 are commercially available, for example in the photolithographic or integrated circuit industry. The designation of first and second is arbitrary, and either sensing element can have either designation and references to the first and second sensing elements 20, 22 can be reversed.

A first sensing element 20 is disposed on or over the substrate 10 surface 12 of the substrate 10 and a second sensing element 22 is disposed above or below the first sensing element 20 in a direction orthogonal to the substrate 10 surface 12, shown by orthogonal direction indicator O. The first and second sensing elements 20, 22 are arranged for sensing the same environmental attribute. The first and second sensing elements 20, 22 can be the same type of sensor, for example substantially identical, and can sense the same environment attribute using the same technology or physical mechanism. In an alternative embodiment, the first and second sensing elements 20, 22 are different types of sensors that are arranged for measuring the same environmental attribute. For example, there are several different mechanisms and sensor types for measuring a magnetic field; the first sensing element 20 can use a different mechanism for measuring the magnetic field than the second sensing element 22. In yet another embodiment, the first and second sensing elements 20, 22 are the same type of sensor but are configured with different attributes, for example having different signal-to-noise ratios, different sensitivities, or different ranges. In various embodiments of the present invention, the first and second sensing elements 20, 22 are transducers, current sensors, magnetic field sensors, electromagnetic field sensors, electrical field sensors, temperature sensors, vibration sensors, or acoustic sensors.

The environmental attribute can be any property of anything found in the environment of the multi-element sensor 99, for example a physical property but not limited to temperature, an electrical field, a magnetic field, mechanical movement, photon flux through a volume, current through a conductor, or pressure. The environmental attribute can include a physical quantity or a parameter relating to a measurement. The property can be a direct or an indirect measurement, for example current through a specified resistor can be related to the temperature and can serve as an indirect measurement of temperature. The property can be, for example, electrically measured or optically measured, and the measurement can be a current, a voltage, a capacitance, or other electrical parameter.

The sensed element 30 can be a structural element or a portion of a structural element, as shown by the rectangular area labeled 30 in the Figures, in which a physical property is detected. Alternatively, it can be a structural element within the rectangular area, for example a conductor in a dielectric structure, in which a physical property is detected. The sensed element 30 can, but need not, provide physical, structural, or mechanical support to other elements of the multi-element sensor 99, for example provide support to the first or second sensing elements 20,22, or both. In another embodiment, the sensed element 30 is simply an area or volume in which the physical property is sensed, measured, or detected and structural support for other elements, such as the first or second sensing elements 20, 22, or both, is provided by other structures in the multi-element sensor 99. In an embodiment, the sensed element 30 is between the first and second sensing elements 20, 22, so that they can measure the same environmental attribute in the same location, improving measurement consistency.

As shown in FIG. 1, the first and second sensing elements 20, 22 can be adhered to a surface using a patterned or unpatterned adhesive layer 18 and can be disposed on the same side of the substrate 10. The first sensing element 20 can be located directly above the second sensing element 22 in a direction O orthogonal to the substrate surface 12. The first sensing element 20 can be mounted directly on the second sensing element 22 (not shown) or a gap or space 16 provided between the first and second sensing elements 20, 22. The first sensing element 20 can be mounted on a layer disposed over the substrate 10, for example incorporating a sensed element 30. In an embodiment, the sensed element 30 can be a current passing through a conductor in or on a layer.

The first and second sensing elements 20, 22, can provide a direct or indirect electrical measurement of the environmental attribute through electrical connections A, B, C, D and can be electrically controlled through the electrical connections A, B, C, D. For example, as shown in FIG. 1, the first sensing element 20 has electrical connections A, B and the second sensing element 22 has electrical connections C, D. A patterned dielectric 24 layer can protect the first and second sensing elements 20, 22 from environmental hazards and to enable patterned electrical connections to the first and second sensing elements 20, 22. The first and second sensing elements 20, 22 can be, for example, integrated circuits. Additional electrical connections can be used and the present invention is not limited to two electrical connections for each sensing element.

Figure 2:
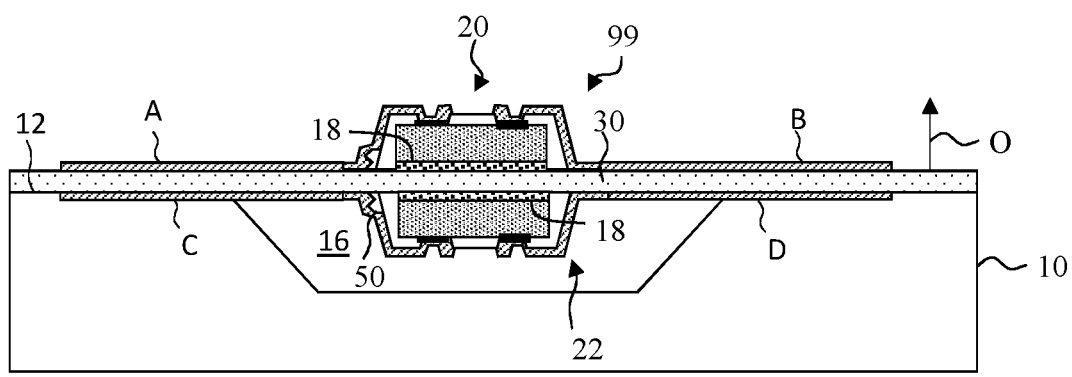
FIG. 2 is a cross section of another embodiment of the present invention.
Figure 3:
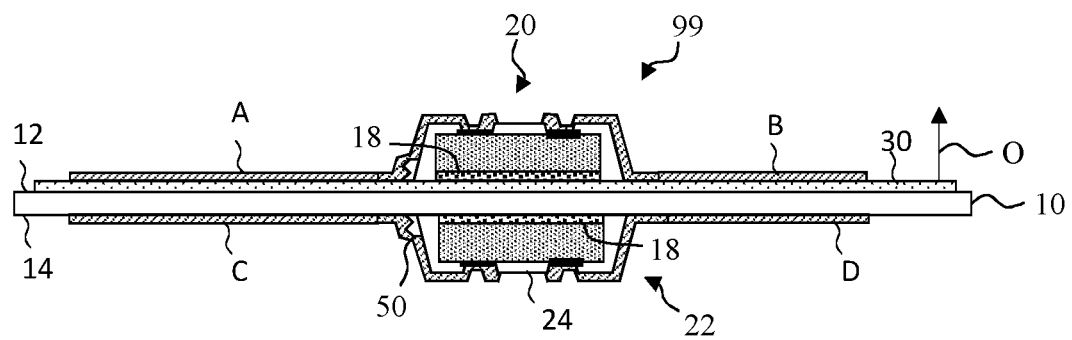
FIG. 3 is a cross section of another embodiment having physically mirrored sensor elements.

Referring to FIG. 2, in another embodiment of the present invention, the first and second sensing elements 20, 22 are disposed in a mirrored arrangement for example mounted on opposite sides of the sensed element 30. Referring to FIG. 3, the first and second sensing elements 20, 22 are also disposed in a mirrored arrangement, for example mounted on opposite sides of the substrate 10, so that the first sensing element 20 is disposed on or over the first side 12 and the second sensing element 22 is disposed on or under the second side 14. Mirrored arrangements can enable a more accurate and consistent signal response by allowing the first and second sensing elements 20, 22 to more nearly measure the same environmental attribute at the same point. In other embodiments, the first sensing element 20 has a similar, reversed, or rotated spatial orientation from the second sensing element 22.

Figure 4:
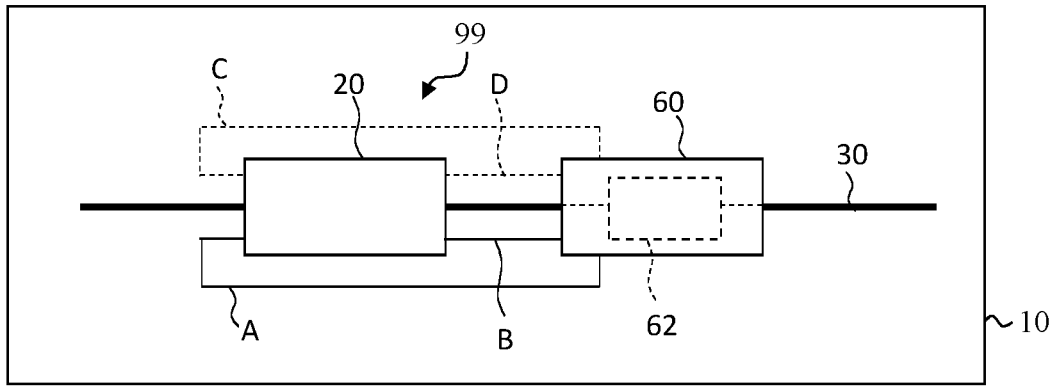
FIG. 4 is a plan view schematic of an embodiment of the present invention.

FIG. 4 is a plan view of the multi-element sensor 99 corresponding to the embodiments of FIG. 1, 2, or 3. Only the first sensing element 20 is seen in FIG. 4 since the second sensing element 22 is disposed beneath the first sensing element 20 in the FIG. 4 plan view. However, the electrical connections A, B of the first sensing element 20 and the electrical connections C, D of the second sensing element 22 (shown with dashed lines to indicate that they can be in a layer beneath a layer on which the first sensing element 20 is disposed) are shown.

According to another embodiment of the present invention and as shown in FIG. 4, a multi-element sensor 99 can comprise a controller 60 including a control circuit 62. The first sensing element 20 is arranged for providing a first sense signal, the second sensing element 22 is arranged for providing a second sense signal, and the control circuit 62 is arranged for receiving the first and second sense signals for example through the electrical connections A, B, C, or D. In an embodiment, the first and second sensing elements 20, 22 continually or repeatedly send signals to the controller 60, which simply receives them without sending any request signal to the first or second sensing elements 20, 22. In another embodiment, the control circuit 62 is arranged for controlling the first and second sensing elements 20, 22, for example through the electrical connections A, B, C, or D and can request or otherwise manage the function or operation of the first or second sensing elements 20, 22. The controller 60 can also communicate with an external device, such as a computer (not shown) to receive requests for information and to provide information. The controller 60 can be disposed on the substrate 10, as shown, or located external to the substrate 10 and electrically connected to the first and second sensing elements 20, 22, for example through electrical wires, cables, or busses.

Various embodiments of the present invention can be made by first providing a substrate 10. A space 16 is formed in the substrate 10, for example by pattern-wise etching, a patterned adhesive 18 is applied, for example by inkjet deposition, the second sensing element 22 is micro-transfer printed from a source wafer onto the adhesive 18, and electrical connections (conductive wires) C, D are formed using photolithographic methods and materials. A sensed element structure, for example a substrate or layer, is laminated over the substrate 10 and the gap 16 and secured to the substrate 10. Alternatively, a support structure (not shown) is provided. The first sensing element 20 is micro-transfer printed from the same or a different source wafer to the sensed element 30 or support structure (not shown). If present, a controller 60 with a control circuit 62 is disposed on the substrate 10 or sensed element 30 or support structure (possibly by micro-transfer printing and including a fractured or separated tether), and electrical connections (conductive wires) A, B are formed using photolithographic methods and materials. By providing suitable control, power, and ground signals to the first and second sensing elements 20, 22, the multi-element sensor 99 can sense an environmental attribute. In the embodiment of FIG. 2, the first and second sensing elements 20, 22 are both applied to the sensed element 30 or a support structure including the sensed element 30. In the embodiment of FIG. 3, the second sensing element 22 is applied to the opposite, second side 14 of the substrate 10 as the first sensing element 20 and the electrical connections C, D formed there.

The first and second sensing elements 20, 22 can be operated together or separately in a variety of ways by the controller 60 and control circuit 62. In the following descriptions, first and second sensing elements 20, 22 are referenced, but the designation of first and second is arbitrary and can be reversed in any of the operations or the locations described. In particular, the physical location or the operation of the first and second sensing elements 20, 22 can be reversed according to embodiments of the present invention and a reference to a sensing element described as above the other sensing element can also refer to a sensing element that is below the other sensing element.

Figure 5:
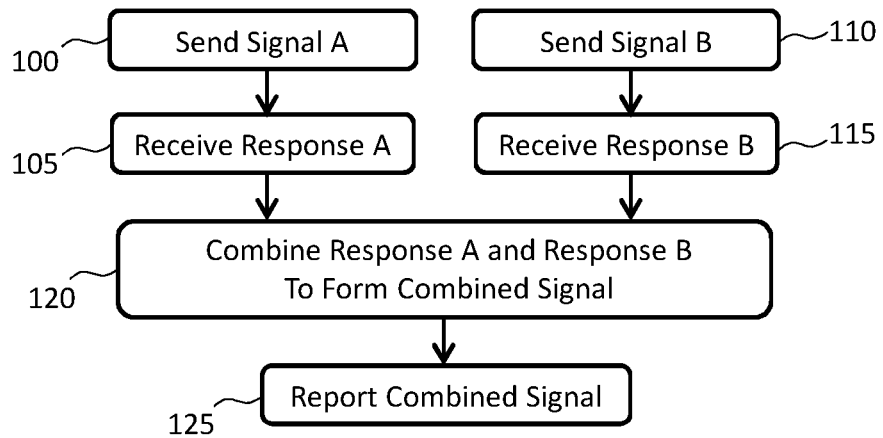
FIGS. 5-14 are flow diagrams illustrating various methods of the present invention.

The multiple first and second sensing elements 20, 22 of the multi-element sensor 99 can provide separate signals that can provide fault tolerance, redundancy or comparative measurements to enable a more fault tolerant, functionally safe, and accurate sensing capability. In one embodiment, the first sensing element 20 provides a first sense signal, the second sensing element 22 provides a second sense signal, and the first and second sense signals together provide a combined sense signal, for example formed by the control circuit 62. The combined sense signal can have at least one different attribute than either the first signal or the second signal. For example, the combined sense signal can have a greater signal-to-noise ratio, a greater range, or a greater sensitivity than either the first or second signals. Referring to FIG. 5, the controller 60 can optionally send a signal in step 100, for example an interrogatory or control signal, to the first sensing element 20. A response from the first sensing element 20 can be received in step 105. At the same time, before, or after a signal is optionally sent in step 110, for example another interrogatory or control signal, to the second sensing element 22 and a response from the second sensing element 22 can be received in step 115. Once signals are received from both the first and the second sensing elements 20, 22, the controller 60 can combine the received signals to form a combined signal in step 120, and the combined signal is reported in step 125, for example to a user, an external computer, or reported with a perceptible signal (e.g., a light from an LED, an audible signal, or a message on a display). Such a signal, can be, for example, a pass/fail signal. The process can then be repeated.

Figure 6:
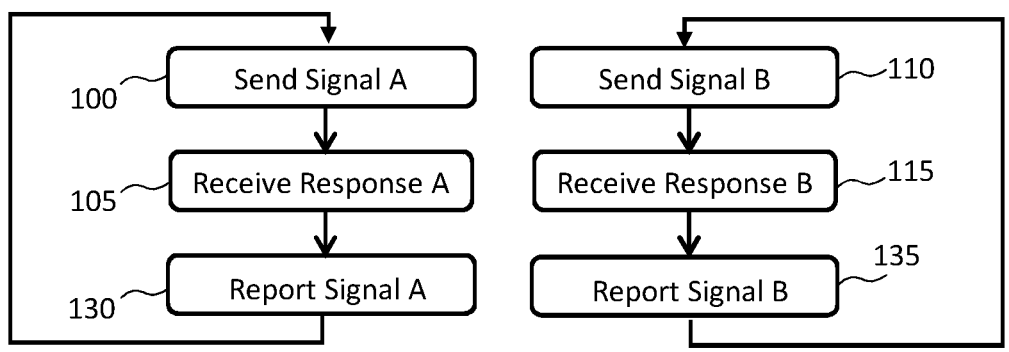

In another embodiment, referring to FIG. 6, both the first and second sensing elements 20, 22 independently and optionally receive a signal, for example from the controller 60, in steps 100 and 110, responses are independently received, for example by the controller 60, in steps 105 and 115, and independently reported in steps 130 and 135. The process can then be repeated.

Figure 7:
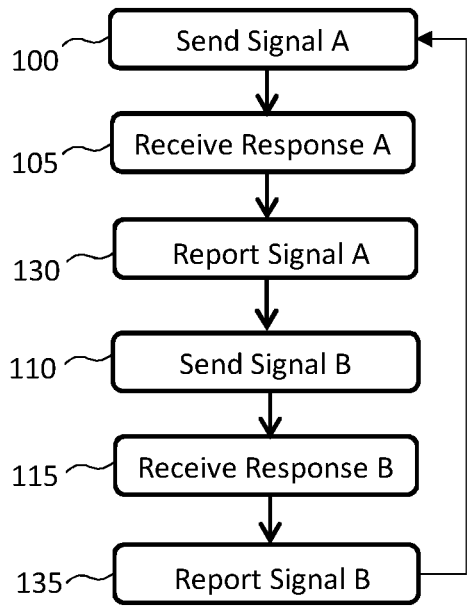

Referring to FIG. 7, rather than independently operating the first and second sensing elements 20, 22, the first and second sensing elements 20, 22 can be operated sequentially, alternately, or iteratively. In this embodiment, a signal is optionally sent to the first sensing element 20 in step 100, a response received in step 105, and reported in step 130. After the response is received or reported from the first sensing element 20, a signal is optionally sent to the second sensing element 22 in step 110, a response received in step 115, and reported in step 135. The process can then be repeated as desired or necessary.

Figure 8:
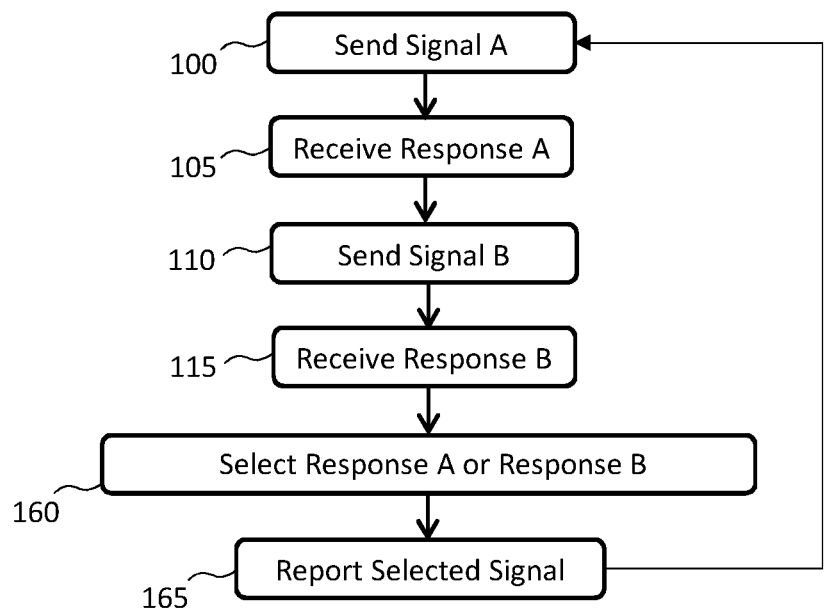
Figure 9:
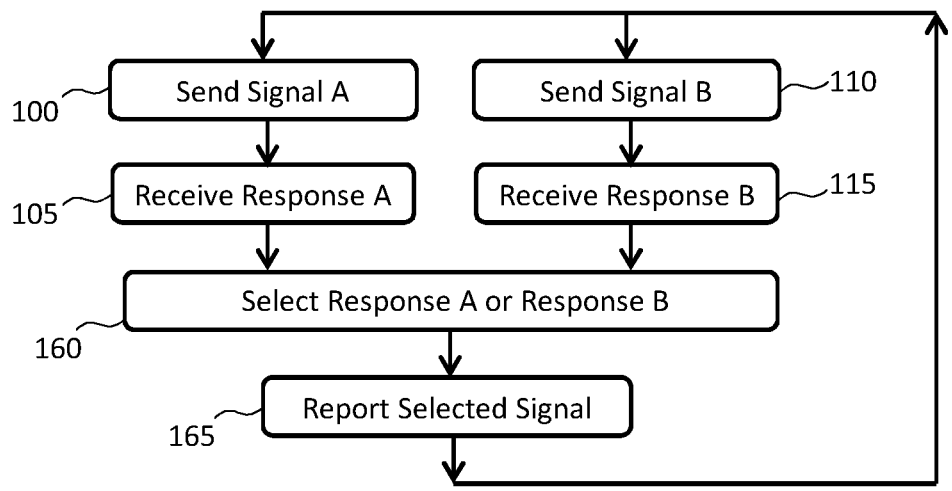

Referring to FIG. 8, in an embodiment, after the responses A and B are sequentially received (steps 105, 115), one or the other is selected (step 160) and reported (step 165). Referring to FIG. 9, the control circuit 62 can receive the first and second sense signals in any order or at the same time and responsively select the first sense signal or the second sense signal (step 160) and report the selected signal (step 165). The process can then be repeated.

Figure 10:
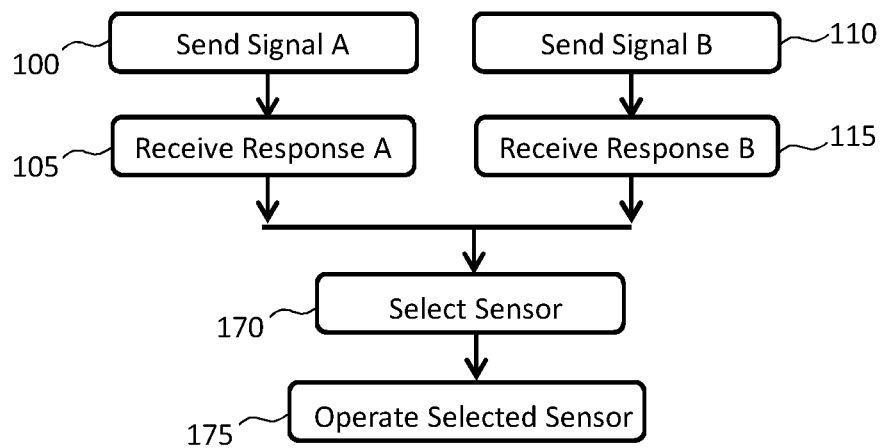

In the embodiment illustrated in FIG. 10, the control circuit 62 controls the first and second sensing elements 20, 22, by optionally sending signals to them in steps 100 and 110, receives a response from each in steps 105 and 115, measures the first and second sense signals (e.g., with the controller 60), and responsive to the measurement, selects a sensing element in step 170 and operates the selected sensing sense element in step 175.

Figure 11:
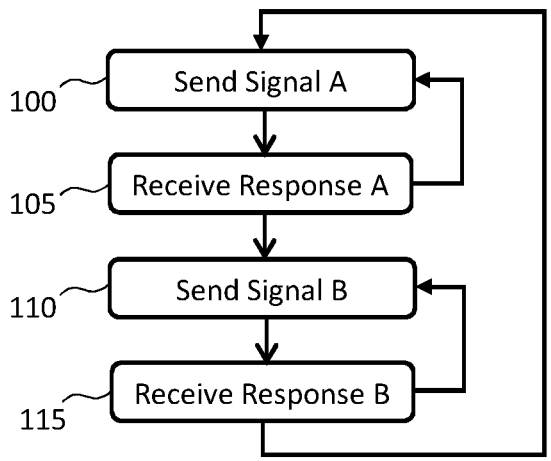

Referring to the embodiment illustrated in FIG. 11, the control circuit 62 optionally repeatedly controls the first sensing elements 20 in step 100, repeatedly receives and measures the corresponding sense signal in step 105 and, responsive to the measured signal, measures the other of the first and second sense signals in steps 110 and 115. For example, the first and second sensing elements 20, 22 can have different ranges and, as long as the received signal is within range of a sensing element, the sensing element is operated. When the received signal is no longer within range of the sensing element, the other sensing element is operated.

In an embodiment, either the first or second sensing element 20, 22 is not functional. In such a situation, the control circuit 62 can detect a non-functional sensing element and operate only the other sensing element or only use information derived from the other sensing element, thus providing a fault-tolerant sensing system with improved functional safety. Thus, the second sensing element 22 can be a redundant sensing element to the first sensing element 20, or vice versa.

Figure 12:
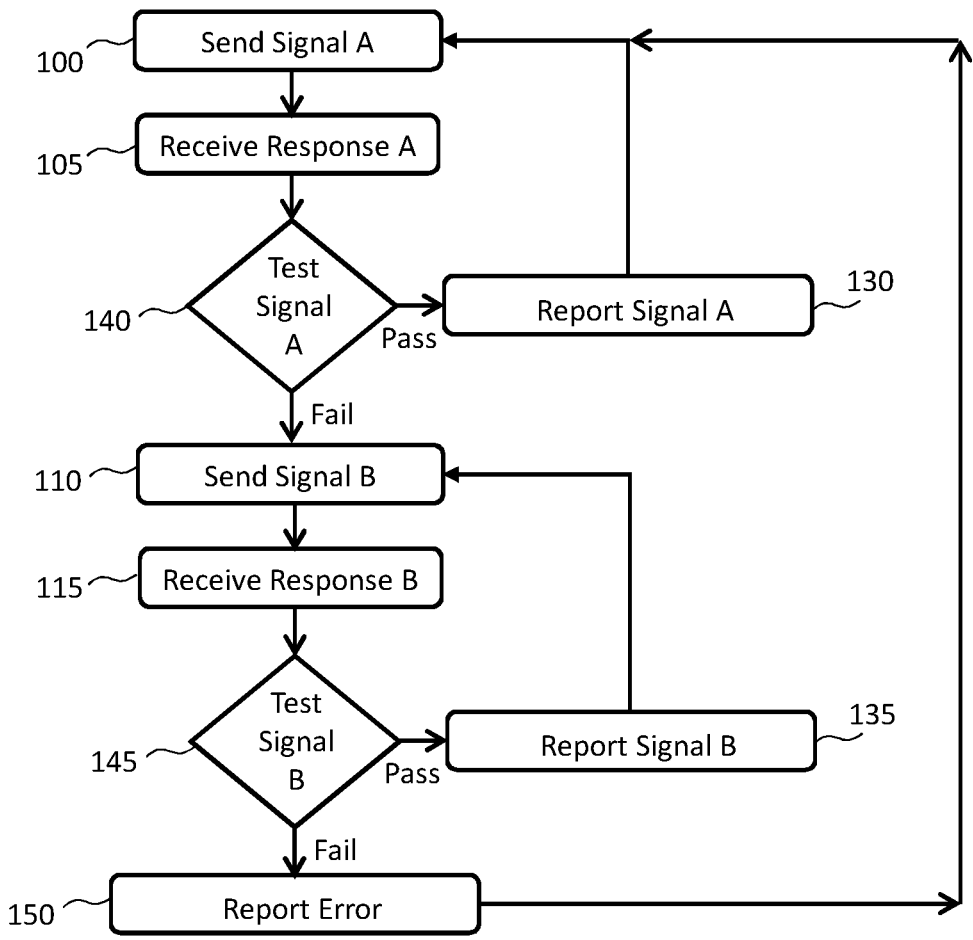

Referring to FIG. 12, an optional control signal is sent to the first sensing element 20 in step 100 and a response received in step 105. The received signal is tested in step 140 and, if the first sensing element 20 passes the received signal is reported in step 130 and the process is repeated. If, however, the first sensing element 20 fails the test, the second sensing element 22 is operated by optionally sending a control signal in step 110, receiving a response in step 115, and testing the received signal in step 145. If the second sensing element 22 passes the received signal is reported in step 135 and the process is repeated. If the second sensing element 22 also fails, an error can be reported in step 150, and the tests attempted again. In various embodiments, a sensing element can fail a test for one or more of several reasons. For example, a sensing element can be non-functional. In another example, the sensing element is functional but the received signal is ineffective for some reason, for example out of range, too weak, or too noisy. In such cases, another sensing element with a different sensor or configuration can be used to provide an effective signal.

Figure 13:
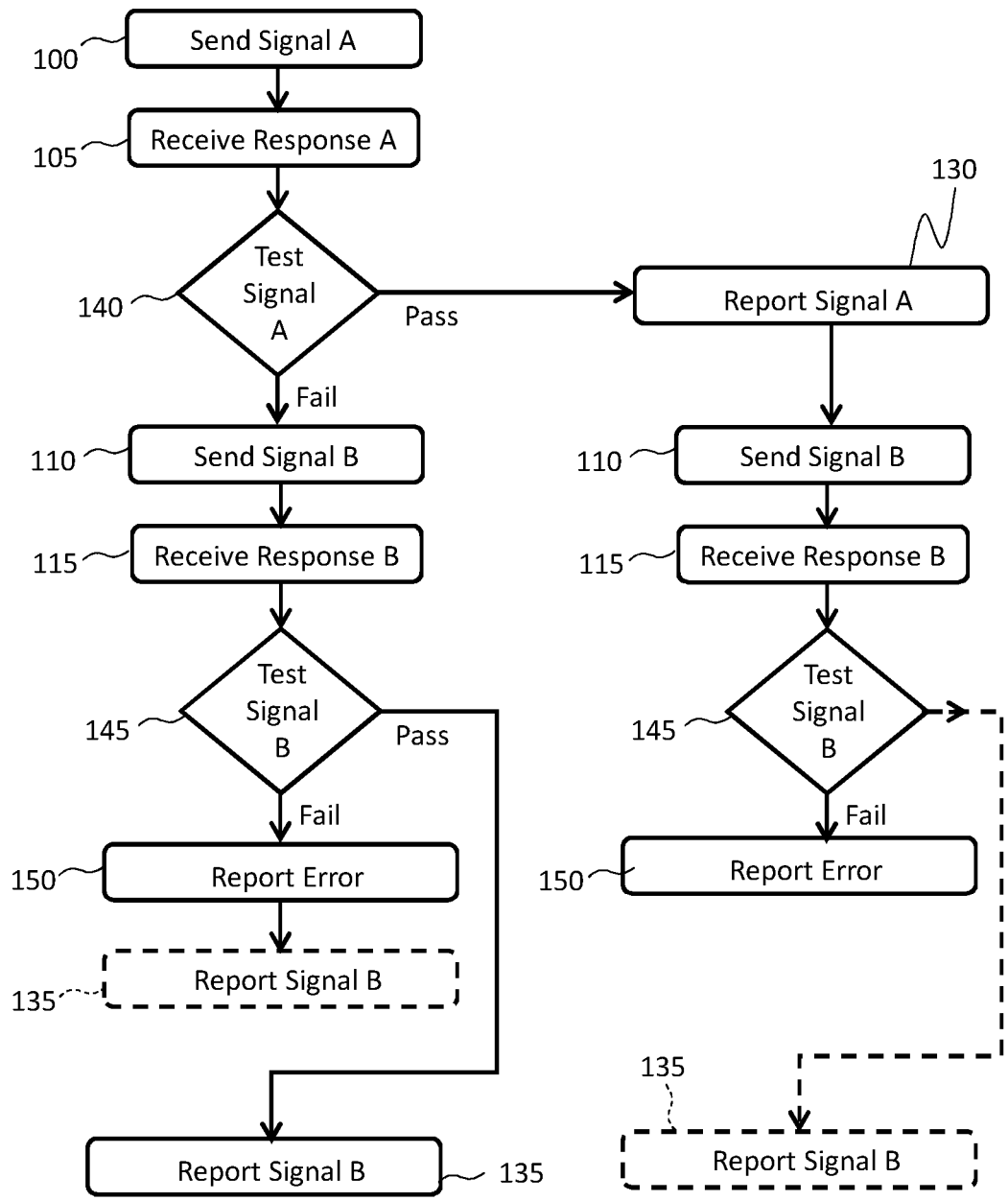

In the alternative embodiment of FIG. 13, rather than repeatedly operating the sensing element that passes the test, when the first sensing element 20 passes the test, the second sensing element 22 is also tested, as shown. If both sensing elements pass the test, the process can be repeated, otherwise an error is reported. In either case, the signals can be reported, for example signal B is reported in step 135 after failing the signal tests. In another embodiment, the tests are different tests. For example, the first test can be a range test and the second test can be a range test and a comparison of the sensor signals. This provides a way to determine sensor functionality and a safety backup mechanism in the event of faults.

Figure 14:
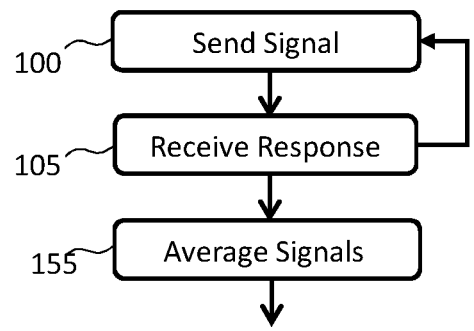

In various embodiments of the present invention, referring to FIG. 14, one or the other of the first and second sensing elements 20, 22, or both, are read repeatedly (step 105) and their received signals averaged together (step 155) to provide a more consistent response. The average value can be calculated by the control circuit 62.

Figure 15:
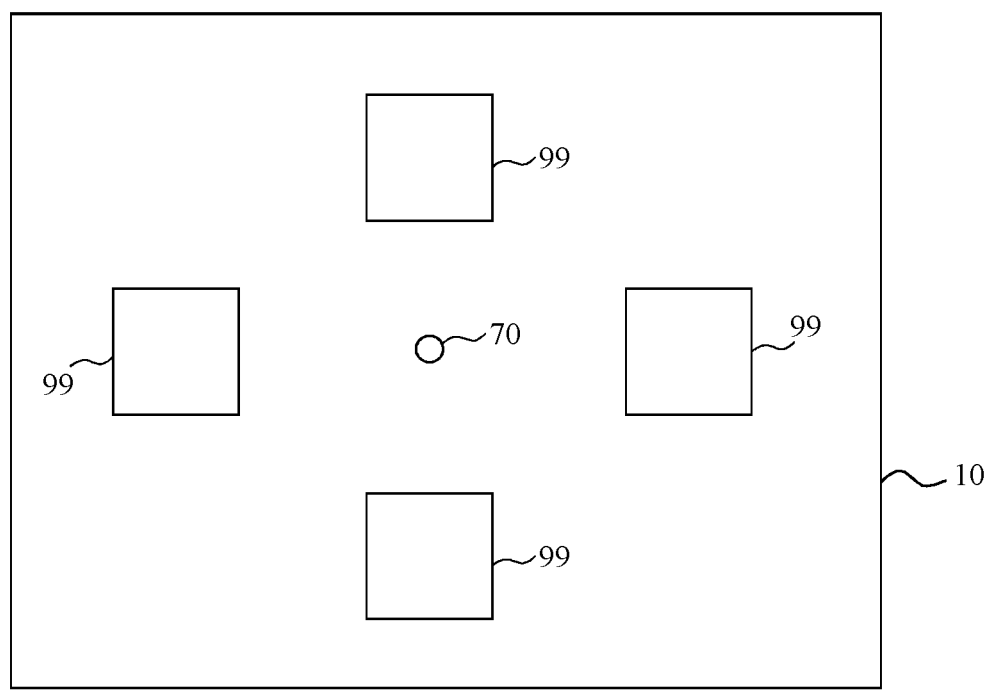
FIG. 15 is a schematic of a plurality of multi-element sensors according to an embodiment of the present invention.

The multi-element sensor 99 can include a plurality of multi-element sensors 99 (each including a first and second sensing elements 20, 22) and the control circuit 62 can operate some or all of the sensing elements. In an embodiment, referring to FIG. 15, the multi-element sensors 99 are disposed around a central point 70 in either two or three dimensions, for example around the sides of a square or cube. In one configuration, the multi-element sensors 99 are equidistant from the central point in either two or three dimensions, as shown in FIG. 15. By equidistant is meant equally distant subject to the tolerances of the manufacturing processes used to place the multi-element sensors 99. The plurality of multi-element sensors 99 can form a multi-element sensor device.

In an embodiment of the present invention, the first sensing element 20 or the second sensing element 22, or both, is a micro-transfer printed sensing element having a broken, fractured, or separated tether 50. Such micro-transfer printed sensing elements can be very small, for example having one of the length, width, or depth less than or equal to one micron, two microns, three microns, five microns, ten microns, twenty microns, fifty microns, or one hundred microns. Small sensing elements enable small multi-element sensors 99 that can be used in restricted volumes and at lower costs.

In embodiments of the present invention, the second sensing element 22 is above or below the first sensing element 20. In a further embodiment, the first and second sensing elements 20, 22 overlap in a direction normal to the surface, as shown in FIGS. 1, 2, and 3. The first sensing element 20 can be directly above or below the second sensing element 22 and they can completely overlap, that is one can be directly above or below the other without any lateral offset. This overlap can reduce the physical size or extent of the multi-element sensor 99 or can improve the measurement consistency by locating the first and second sensing element 20, 22 closer together so that they take measurements at the same, or nearly the same, physical location.

Sensing elements of the present invention can include micro-transfer-printable sensing elements transferred from a native source wafer to another, destination substrate 10 that can be made of a different material than the source wafer. The micro-transfer-printable sensing elements can be relatively small, for example in embodiments each micro-transfer-printable sensing elements has a width from 2 to 5 μm, 5 to 10 μm, 10 to 20 μm, or 20 to 50 μm, each micro-transfer-printable sensing elements has a length from 2 to 5 μm, 5 to 10 μm, 10 to 20 μm, or 20 to 50 μm, or each micro-transfer-printable sensing elements has a height from 2 to 5 μm, 4 to 10 μm, 10 to 20 μm, or 20 to 50 μm.

Thus, the multi-sensing element 99 can itself be a micro-transfer printed element having a substrate 10 (for example from a multi-sensing element source wafer) on which the first and second sensing elements 20, 22 are micro-transfer printed and on which the electrical connections A, B, C, D are formed. The micro-transfer printable multi-sensor element 99 can then be etched and released from the source wafer using tether structures to keep the multi-element sensor 99 in position with respect to the source wafer. When micro-transfer printed to a desired location, the multi-element sensor 99 will then itself have a fractured, broken, or separated tether.

Methods of forming micro-transfer printable structures are described, for example, in the paper "AMOLED Displays using Transfer-Printed Integrated Circuits" (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled "Compound Micro-Assembly Strategies and Devices", which is hereby incorporated by reference in its entirety. In an embodiment, the multi-element sensor 99 is a compound micro-assembled device. Additional details useful in understanding and performing aspects of the present invention are described in U.S. patent application Ser. No. 14/743,981, filed Jun. 18, 2015, entitled "Micro Assembled LED Displays and Lighting Elements", which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in."

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. A multi-element sensor, comprising:
a substrate having a surface;
a first sensing element disposed on or over the substrate surface, the first sensing element being arranged for sensing an environmental attribute; and
a second sensing element disposed over the same substrate surface as the first sensing element, above the first sensing element in a direction orthogonal to the substrate surface, the second sensing element being arranged for sensing the same environmental attribute, wherein the first sensing element has a different range or sensitivity than the second sensing element.

2. The multi-element sensor of claim 1, wherein the first sensing element has a different range than the second sensing element.

3. The multi-element sensor of claim 1, wherein the first and second sensing elements are transducers, current sensors, magnetic field sensors, electromagnetic field sensors, electrical field sensors, temperature sensors, vibration sensors, optical sensors, or acoustic sensors.

4. The multi-element sensor of claim 1, wherein the multi-element sensor includes multiple pairs of first and second sensing elements.

5. The multi-element sensor of claim 1, wherein one of the length, width, or depth of the first or second sensing element is less than or equal to one micron, two microns, three microns, five microns, ten microns, twenty microns, fifty microns, or one hundred microns.

6. The multi-element sensor of claim 1, wherein the first sensing element or the second sensing element, or both, is a micro-transfer printed sensing element having a fractured or separated tether.

7. The multi-element sensor of claim 1, wherein the second sensing element is a redundant sensing element to the first sensing element, for providing fault tolerance to the first sensing element, or for providing functional safety by providing a backup to the first sensing element.

8. The multi-element sensor of claim 1, wherein the first sensing element has a different sensitivity than the second sensing element.

9. The multi-element sensor of claim 1, wherein the first sensing element is a different sensor than the second sensing element.

10. A multi-element sensor device, comprising a plurality of multi-element sensors according to claim 1.

11. The multi-element sensor device of claim 10, wherein the multi-element sensors of the plurality of multi-element sensors are disposed around a central point in either two or three dimensions.

12. A multi-element sensor, comprising:
a substrate having a surface;
a first sensing element disposed on or over the substrate surface, the first sensing element being arranged for sensing an environmental attribute; and
a second sensing element disposed over the same substrate surface as the first sensing element, above the first sensing element in a direction orthogonal to the substrate surface, the second sensing element being arranged for sensing the same environmental attribute,
wherein the first sensing element has a reversed, rotated, or mirrored spatial orientation from the second sensing element.

13. The multi-element sensor of claim 12, wherein the first sensing element has a reversed spatial orientation from the second sensing element.

14. The multi-element sensor of claim 12, wherein the first sensing element has a rotated spatial orientation from the second sensing element.

15. The multi-element sensor of claim 12, wherein the first sensing element has a mirrored spatial orientation from the second sensing element.

16. The multi-element sensor of claim 12, wherein the first sensing element has a different range or sensitivity than the second sensing element.

17. A multi-element sensor, comprising:
a substrate having a surface;
a first sensing element disposed on or over the substrate surface, the first sensing element being arranged for sensing an environmental attribute; and
a second sensing element disposed over the same substrate surface as the first sensing element, above the first sensing element in a direction orthogonal to the substrate surface, the second sensing element being arranged for sensing the same environmental attribute,
wherein the first sensing element is adapted to provide a first sense signal, the second sensing element is adapted to provide a second sense signal, and
further comprising a controller, the controller having a control circuit that can receive the first and/or second sense signals.

18. The multi-element sensor of claim 17, wherein the controller is disposed on the substrate.

19. The multi-element sensor of claim 17, wherein the control circuit is adapted to measure the first and second sense signals and is arranged to produce, responsive to the measurement, a combined sense signal from the first and second sense signals, or to select the first sense signal or the second sense signal, or to alternately operate the first and second sensing elements, or to measure the first and second sense signals and, responsive to the measurement, to operate either the first sensing sense element or the second sensing element, or to measure one of the first and second sense signals and, responsive to the measured signal, to measure the other of the first and second sense signals, or to measure the first and second sense signals, compare the first and second sense signals, and, responsive to the comparison, determine a fault in either one of the sensing elements.

20. The multi-element sensor of claim 17, wherein the first sensing element has a different range or sensitivity than the second sensing element.

* * * * *